United States Patent
Lin et al.

(10) Patent No.: US 6,838,708 B2
(45) Date of Patent: Jan. 4, 2005

(54) I/O CELL AND ESD PROTECTION CIRCUIT (75) Inventors: Shi-Tron Lin, Taipei (TW); Wei-Fan Chen, Taichung (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 10/454,710

(22) Filed: Jun. 4, 2003

(65) Prior Publication Data
US 2004/0245546 A1 Dec. 9, 2004

(51) Int. Cl.[7] .................... H01L 29/74; H01L 31/111
(52) U.S. Cl. .................... 257/173; 257/175; 257/355
(58) Field of Search ................ 257/173, 175, 257/355

(56) References Cited

U.S. PATENT DOCUMENTS

| 5,248,892 A | 9/1993 | Van Roozendaal et al. |
| 5,721,439 A | 2/1998 | Lin |
| 6,046,087 A | 4/2000 | Lin et al. |
| 6,064,095 A | 5/2000 | Fu |
| 6,153,913 A | 11/2000 | Hsu et al. |
| 6,157,065 A | 12/2000 | Huang et al. |
| 6,236,073 B1 | 5/2001 | Hsu |
| 2004/0080339 A1 * | 4/2004 | Kubo .................... 326/83 |

* cited by examiner

Primary Examiner—David Nelms
Assistant Examiner—Tu-Tu Ho
(74) Attorney, Agent, or Firm—Raymond Sun (57) ABSTRACT

An ESD protection circuit has a VDD bus, a VSS bus, an IC pad, a PMOS transistor coupled to the IC pad and the VDD bus, and an NMOS transistor coupled to the IC pad and the VSS bus. The pitch of the PMOS can smaller than the pitch of the NMOS, and the drain-contact-to-gate-spacing (DCGS) for the PMOS can be smaller than the DCGS for the NMOS.

26 Claims, 7 Drawing Sheets

I/O CELL AND ESD PROTECTION CIRCUIT

BACKGROUND OF THE INVENTION

1. Field of the Invention

The present invention relates to input/output (I/O) circuits and electrostatic discharge (ESD) protection circuits, and in particular, to I/O circuits and ESD protection circuits that have a reduced layout area and which experience improved ESD performance.

2. Description of the Prior Art

An NMOSFET is a very effective ESD protection device. In one known application, with the gate connected to a gate-driving signal, the NMOSFET is used as the pull-down device of a CMOS buffer to drive an output voltage. In another known application, with the gate electrically connected to ground, the NMOSFET is used to protect an input pin or power bus during an ESD event.

In a PS mode (i.e., power to Vss) ESD event, when a positive ESD transient voltage is applied to an IC pin while a VSS power pin is at ground potential, the protection of an NMOSFET depends greatly on the snap-back mechanism for conducting large amounts of ESD current between the drain and source. To start, the high electric field at the drain junction causes impact ionization, which generates both minority and majority carriers. The minority carriers flow toward the drain contact and the majority carriers flow toward the substrate/Pwell contact to cause a local potential build up in the current path in the Pwell. When the local substrate potential is 0.6V higher than the adjacent n+ source potential, the source junction becomes forward biased. The forward biased source junction injects minority carriers (electrons) into the Pwell, and these minority carriers eventually reach the drain junction to further enhance the impact ionization. As a continuous loop, the MOSFET gets into a low impedance (snap back) state to conduct large amounts of ESD current.

Figure 1A:
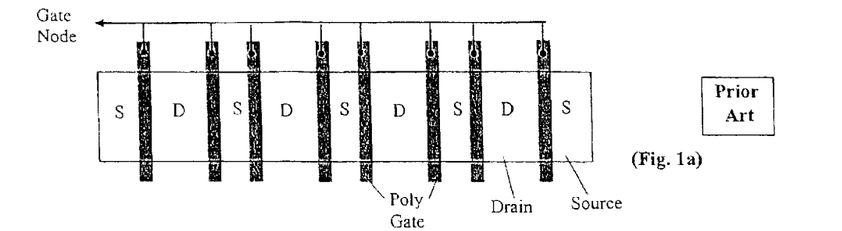
FIG. 1a illustrates the arrangement of a conventional multi-finger NMOS structure.
Figure 1B:
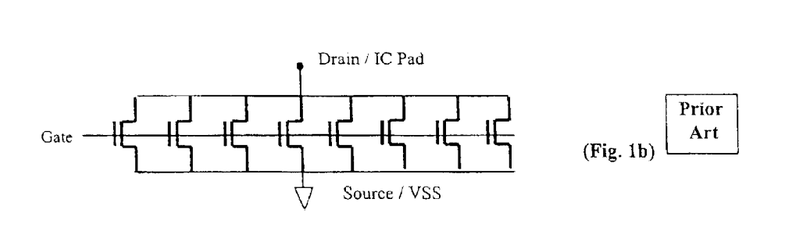

In a multi-finger NMOS structure as shown in FIGS. 1a and 1b, not all gate fingers may turn on during an ESD event. This is because the first few gate fingers, having turned on quickly, get into a snap-back low-impedance condition, thereby reducing the drain terminal to source terminal voltage to a transient voltage which is less than the trigger voltage of the NMOS device. This potentially prevents other gate fingers from turning on. Therefore, with only a limited number of gate fingers turned on to absorb the ESD energy, the size of the NMOSFET is effectively reduced and the ESD performance degrades.

When a gate finger is triggered in an ESD event, the entire finger turns on. This is due to a cascading effect that a local source junction in a forward biasing state will inject lots of carriers into the substrate to flow towards the drain junction, which in turn generates more minority carriers (due to impact ionization) flowing back towards the p+ guard ring to raise the adjacent Pwell potential. Therefore, the adjacent source region is also turned into a forward bias state. With this cascading effect, the entire gate finger turns on into a snap back condition.

Figure 2:
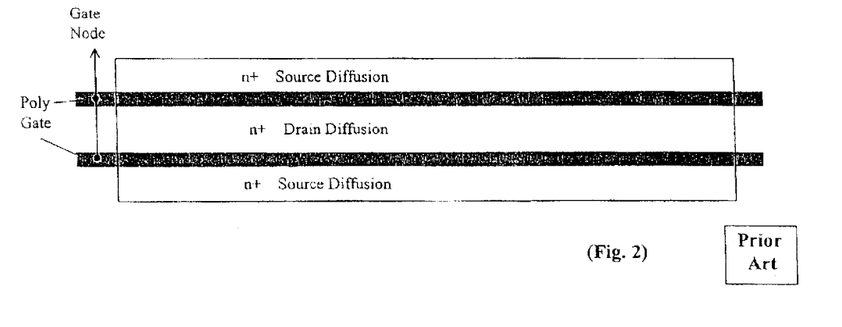
FIG. 2 illustrates the arrangement of a conventional multi-finger NMOS structure that has medium-to-long gate fingers.

Experimental data has shown that a medium-to-long gate-finger NMOS structure (e.g., 40 um×2 or 100 um×2 fingers) as shown in FIG. 2 has a better PS-mode ESD performance than a short-gate-finger structure (e.g., 20 um×10 fingers) as shown in FIG. 1a, despite the fact that both structures have the same total gate width of 200 um. This is because each finger in a short-gate-finger structure represents only a small percentage of the total gate width, and during a PS-mode ESD event, only a few fingers will be turned on for the reasons described above in connection with FIGS. 1a and 1b.

Figure 3A:
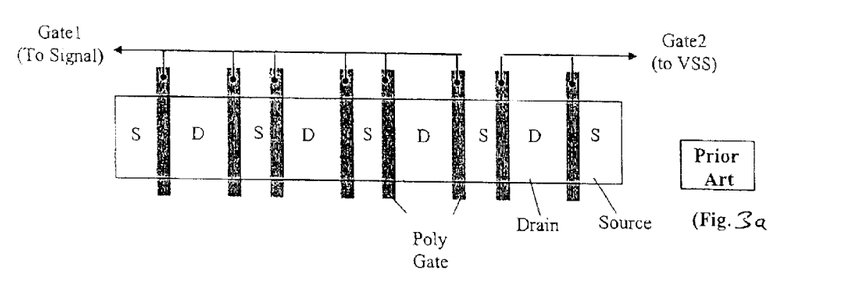
FIG. 3a illustrates the arrangement of another conventional multi-finger NMOS structure.
Figure 3B:
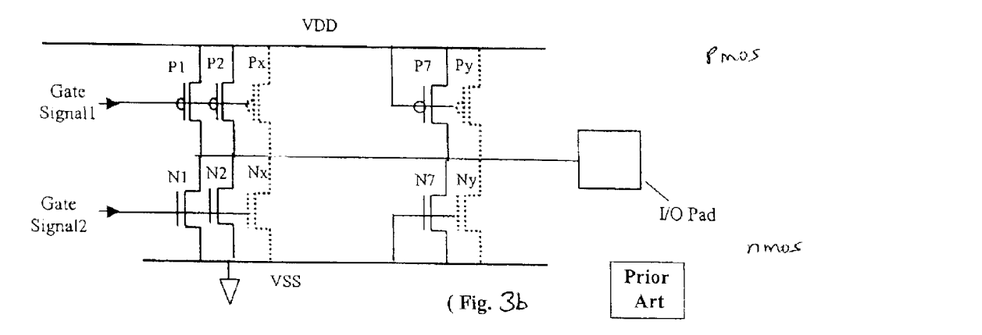

Prior art MOSFET-based I/O structures with self-ESD protection typically include a number of NMOSFET and PMOSFET transistors. As shown in FIGS. 3a and 3b, the pull-down NMOSFET may comprise a number of gate elements, with some gate elements connected to a first gate signal for the output transistor portion, and some gate elements connected to the VSS bus/Ground as the input protection ESD structure. Similarly, the pull-up PMOSFET may comprise a number of gate elements, with some gate elements connected to a second gate signal for the output transistor portion, and some gate elements connected to the VDD bus as the input protection ESD structure. In the prior art, a gate element formed of a polysilicon element is typically coupled either to a gate signal or to a power bus.

Figure 4:
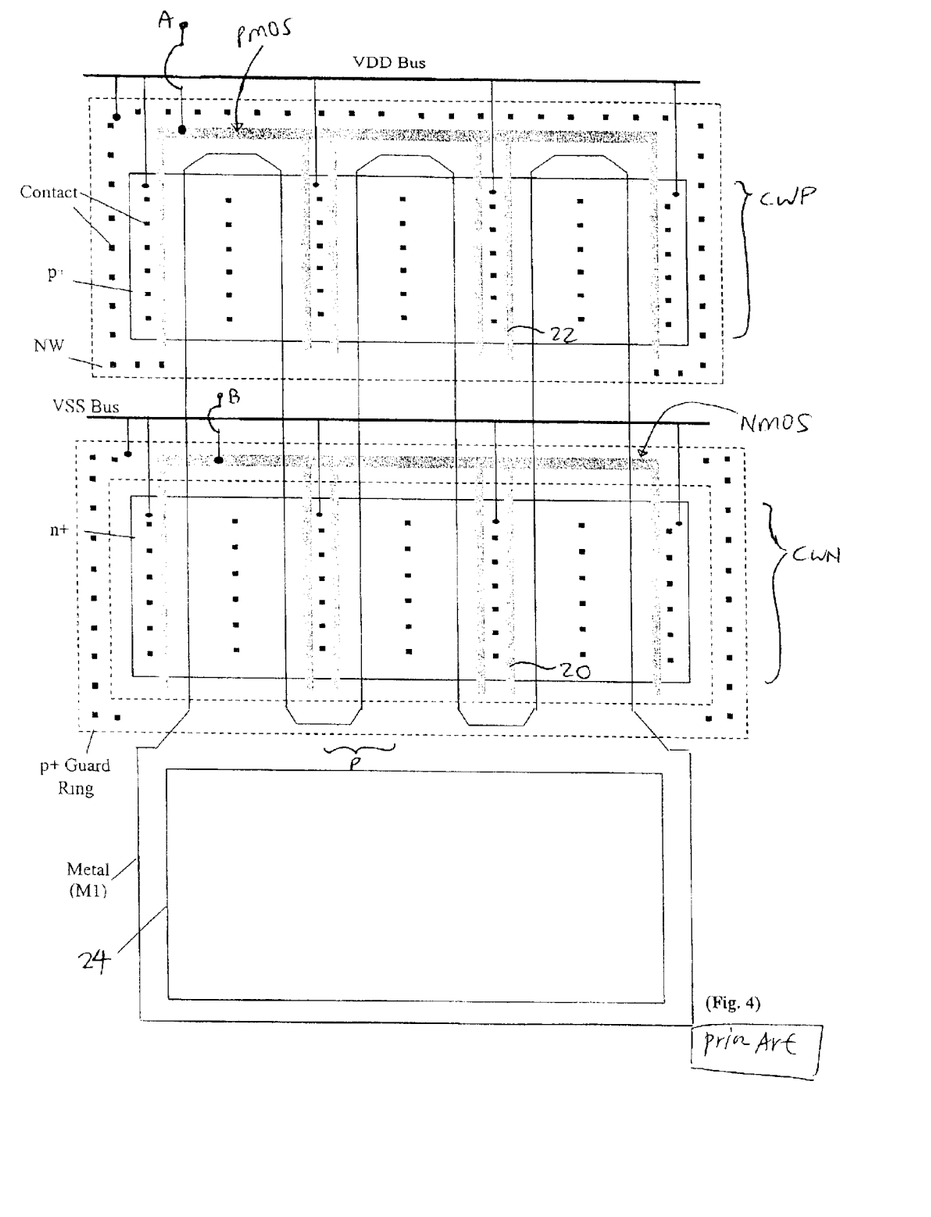
FIG. 4 is a layout of a conventional I/O cell or ESD protection circuit having pull-up PMOS and pull-down NMOS multi-gate-finger transistors coupled to an IC pad.

FIG. 4 shows a typical layout of a conventional I/O cell or input ESD protection circuit having pull-up PMOS and pull-down NMOS multi-gate-finger transistors coupled to an IC pad. When used as an input ESD protection circuit, the PMOS gate is coupled to the VDD bus and the NMOS gate is coupled to the VSS bus. When used as an output circuit, the PMOS gate and NMOS gate are coupled to the same or different gate signals. The PMOS gate is node A, while the NMOS gate is node B. Node A can be connected to the VDD bus, while node B can be connected to the VSS bus for input protection. Alternatively, nodes A and B can be connected to an input signal such that the NMOS and the PMOS function as a CMOS-inverter output buffer. As yet another alternative, nodes A and B can be coupled to different signals for a flexible control of the state of the NMOS and the PMOS.

In the layout of FIG. 4, the NMOS gate fingers 20 and PMOS gate fingers 22 are disposed parallel to each other, and can be positioned on the same side of a bond pad 24. Alternatively, these fingers 20, 22 can be positioned on the opposite sides (not shown) of a bond pad 24. In addition, each NMOS gate finger 20 is generally aligned with a corresponding PMOS gate finger 22, and the pitch p (as defined below) between the source contact and the drain contact for each gate finger 20, 22 is also approximately the same. In addition, FIG. 4 also shows that the channel width CWN of each gate finger 20 in the NMOS is about the same as the channel width CWP of each gate finger 22 in the PMOS. In this regard, since a PMOS has lower mobility, when it is used as an output buffer, each PMOS gate finger 22 needs to be at least as long as, and maintain the same pitch as, each NMOS gate finger 20.

The following are some definitions for terms that will be used throughout this disclosure:

"Pitch" (denoted by "p") means the distance between the center of the drain contact and the center of the source contact for each gate finger.

"DCGS" means drain-contact-to-gate-spacing.

"SCGS" means source-contact-to-gate-spacing.

SUMMARY OF THE DISCLOSURE

It is an object of the present invention to reduce the layout area of I/O circuits and ESD protection circuits.

It is another object of the present invention to provide the (pull-up) PMOS gate fingers with a substantially shorter pitch than the pitch for the (pull-down) NMOS gate fingers.

It is yet another object of the present invention to provide the PMOS gate fingers with a substantially shorter gate finger length and with a greater number of gate fingers than for the NMOS.

It is yet a further object of the present invention to provide the PMOS transistor with a substantially shorter DCGS than that of the NMOS gate transistor. This will save layout space without degrading ESD protection strength.

The objectives of the present invention are accomplished by providing an ESD protection circuit that has a VDD bus, a VSS bus, an IC pad, a PMOS transistor coupled to the IC pad and the VDD bus, and an NMOS transistor coupled to the IC pad and the VSS bus. In one embodiment, the pitch of the PMOS is smaller than the pitch of the NMOS. According to another embodiment, the DCGS for the PMOS is smaller than the DCGS for the NMOS, and the SCGS for the PMOS is smaller than the SCGS for the NMOS.

BRIEF DESCRIPTION OF THE DRAWINGS

FIG. 1b illustrates the electrical components of the conventional multi-finger NMOS structure of FIG. 1a.

FIG. 3b illustrates the electrical components of the conventional multi-finger NMOS structure of FIG. 3a.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known devices and mechanisms are omitted so as to not obscure the description of the present invention with unnecessary detail.

The present invention provides modifications to known I/O cells and ESD protection circuits that have pull-up PMOS and pull-down NMOS multi-gate-finger transistors coupled to an IC pad. These modifications are directed towards reducing the layout area of these I/O cells and ESD protection circuits. This reduction in layout area can be accomplished by one or more of the following: (i) providing (pull-up) PMOS gate fingers with a substantially shorter pitch than the pitch for the (pull-down) NMOS gate fingers, (ii) providing the PMOS gate fingers with a substantially shorter gate finger length and with a greater number of gate fingers than for the NMOS, and (iii) providing the PMOS transistor with a substantially shorter DCGS than that of the NMOS gate transistor.

Figure 5:
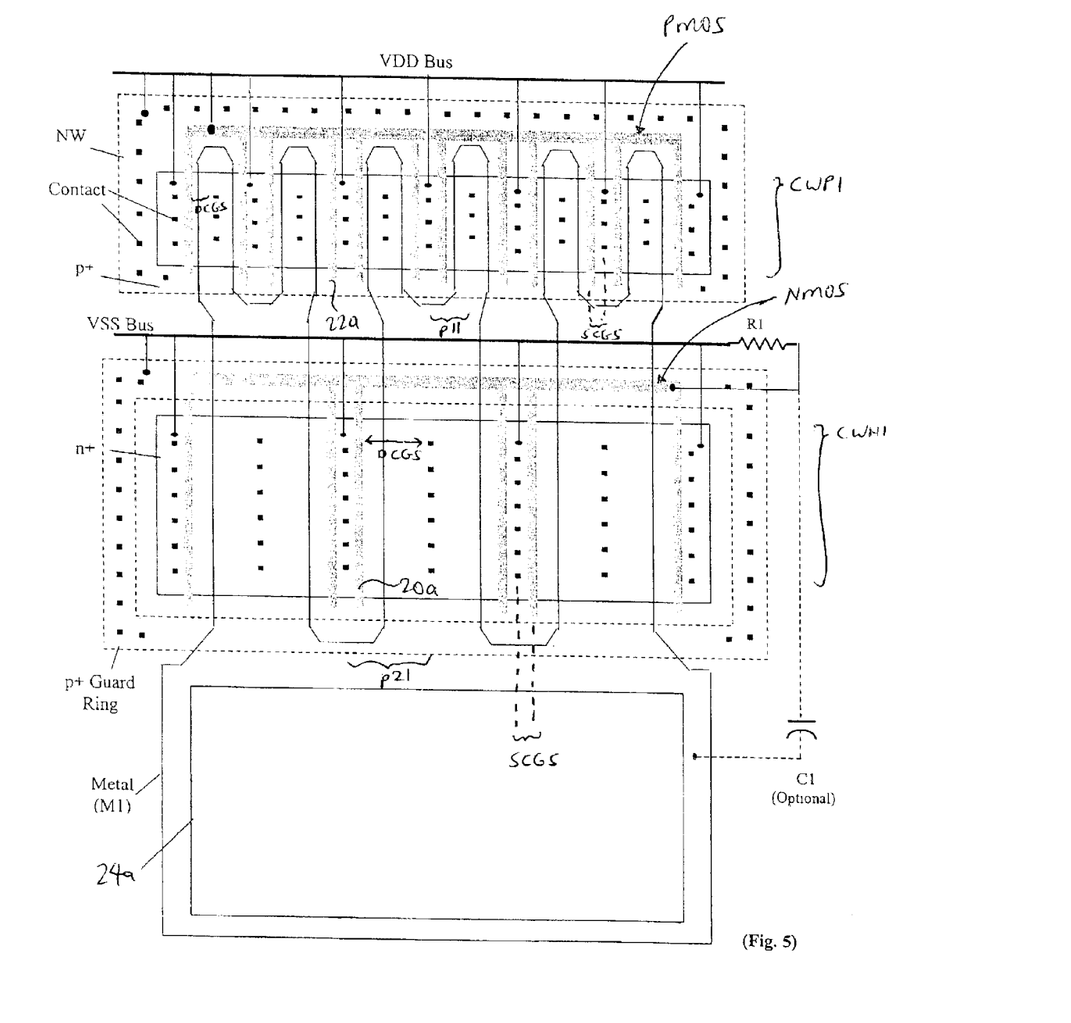
FIG. 5 is a layout of an I/O cell or ESD protection circuit according to one enbodiment of the present invention.
Figure 8:
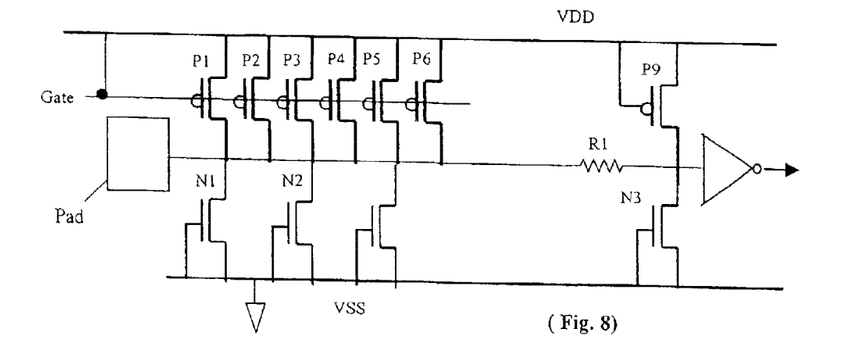
FIG. 8 illustrates the circuit schematics for the layout in FIG. 5 without the capacitor C1.

FIG. 5 illustrates one preferred embodiment of the present invention. FIG. 8 illustrates the circuit schematics for the layout in FIG. 5 without the capacitor C1. The layout in FIG. 5 is similar to the layout in FIG. 4, except for two modifications. First, the pitch p11 for the PMOS gate fingers 22a is now shorter than the pitch p21 for the NMOS gate fingers 20a. In one embodiment, p11 is less than 80% of the pitch p21, and in one example, p21=5 um and p11=3.5 um. In another embodiment, p11 is about 50% (i.e., half) of the pitch p21. Second, the channel width CWP1 of the PMOS gate fingers 22a is also shorter than the channel width CWN1 for the NMOS gate fingers 20a. In one embodiment, the length of CWP1 is less than 60%, and is preferably about 50% (i.e., half), of the length of CWN1, and in one example CWP1=22 um and CWN1=40 um. Thus, the layout area can be reduced or saved by reducing the pitch and the length of the PMOS gate fingers 22a.

Since the pitch p11 is less than the pitch p21, the DCGS of the PMOS will also be less than the DCGS of the NMOS. In one embodiment, the DCGS for the PMOS is less than 81% of the DCGS for the NMOS. The SCGS of the PMOS can also be less than the DCGS of the NMOS. In one embodiment, the SCGS for the PMOS is less than 81% of the SCGS for the NMOS. As one non-limiting design example, the NMOS DCGS is 5 um, and the NMOS SCGS is 1 um to 2 um, while the PMOS DCGS is from 1.5 um to 2.5 um, and the PMOS SCGS is from 0.5 um to 1 um.

FIG. 5 further shows that the NMOS gate fingers 20a can be coupled to a power bus (VSS) by a resistor R1 (or simply shorted to the power bus) so as to lower the trigger voltage needed for snap-back to occur. Optionally, a capacitor C1 can be coupled between the NMOS gate fingers 20a and the drain of the NMOS transistor. Alternatively, the optional capacitor C1 can be coupled between the NMOS gate fingers 20a and a bond pad 24a.

Figure 6:
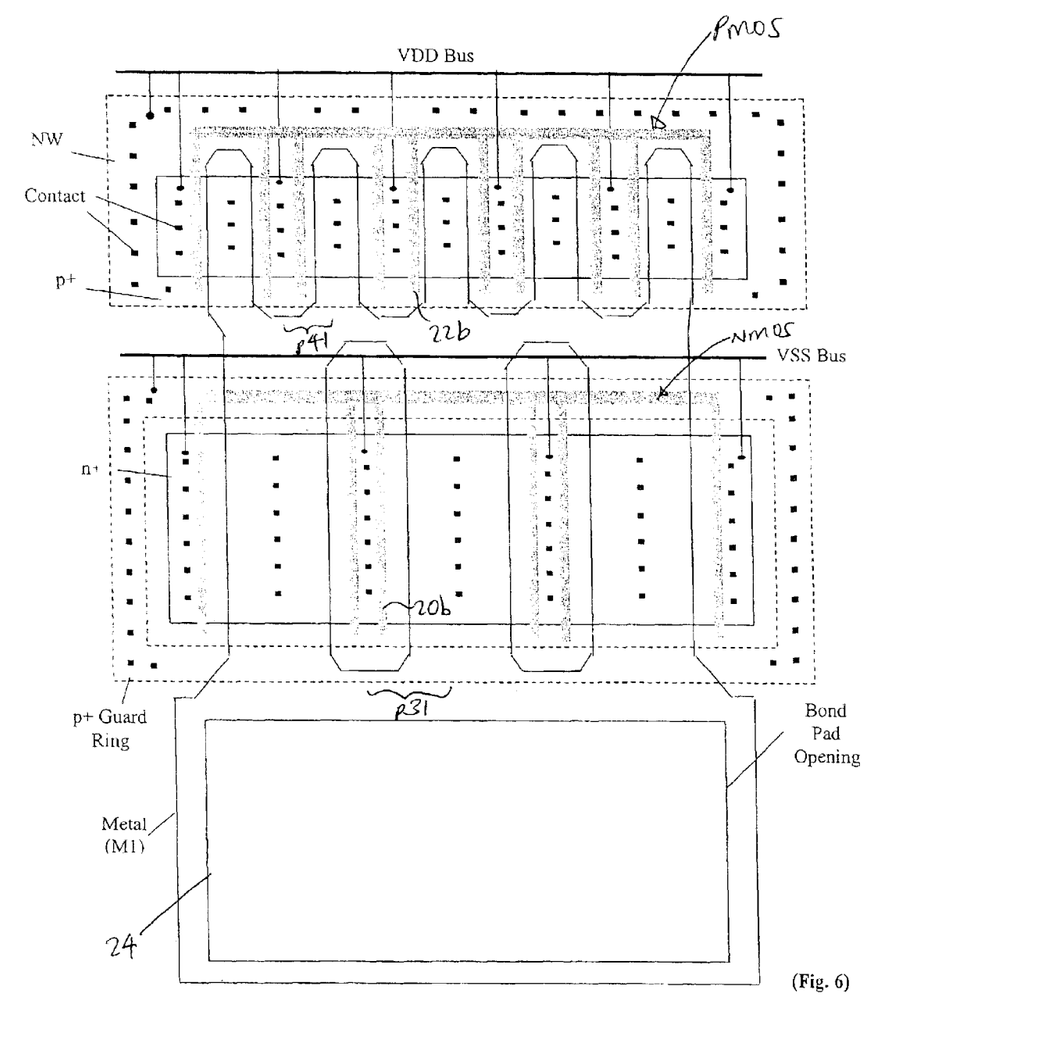
FIG. 6 is a layout of an I/O cell or ESD protection circuit according to another enbodiment of the present invention.
Figure 9:
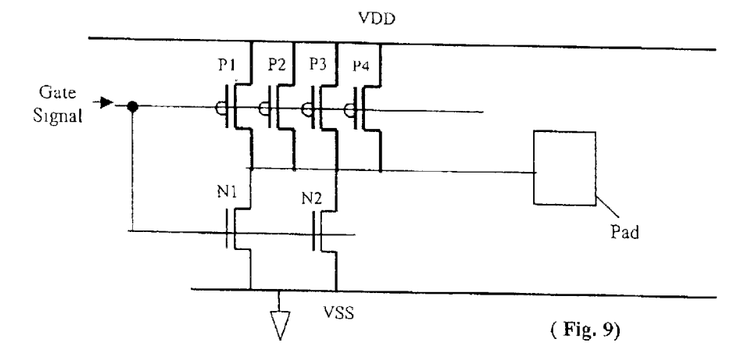
FIG. 9 illustrates the circuit schematics for the layout in FIGS. 5 and 6, but with the NMOS gates and PMOS gates coupled to a gate signal.

FIG. 6 illustrates further modifications that can be made to the layout in FIG. 5. In FIG. 5, each gate finger 20a of the NMOS is aligned with a corresponding gate finger 22a of the PMOS, but in FIG. 6, none of the gate fingers 20b of the NMOS are aligned with any of the gate fingers 22b of the PMOS. However, all the gate fingers 20b, 22b are still parallel to each other. In addition, the pitch p31 for the NMOS is not an exact multiple of the pitch p41 for the PMOS. One benefit of not aligning the gate fingers 20b, 22b is that the non-alignment provides more flexibility in the transistor design (such as for the optimization of drain-to-gate contact spacings of the PMOS and NMOS. FIG. 9 illustrates the circuit schematics for the layout in FIGS. 5 and 6, but with the NMOS gates and PMOS gates coupled to a gate signal.

Figure 7:
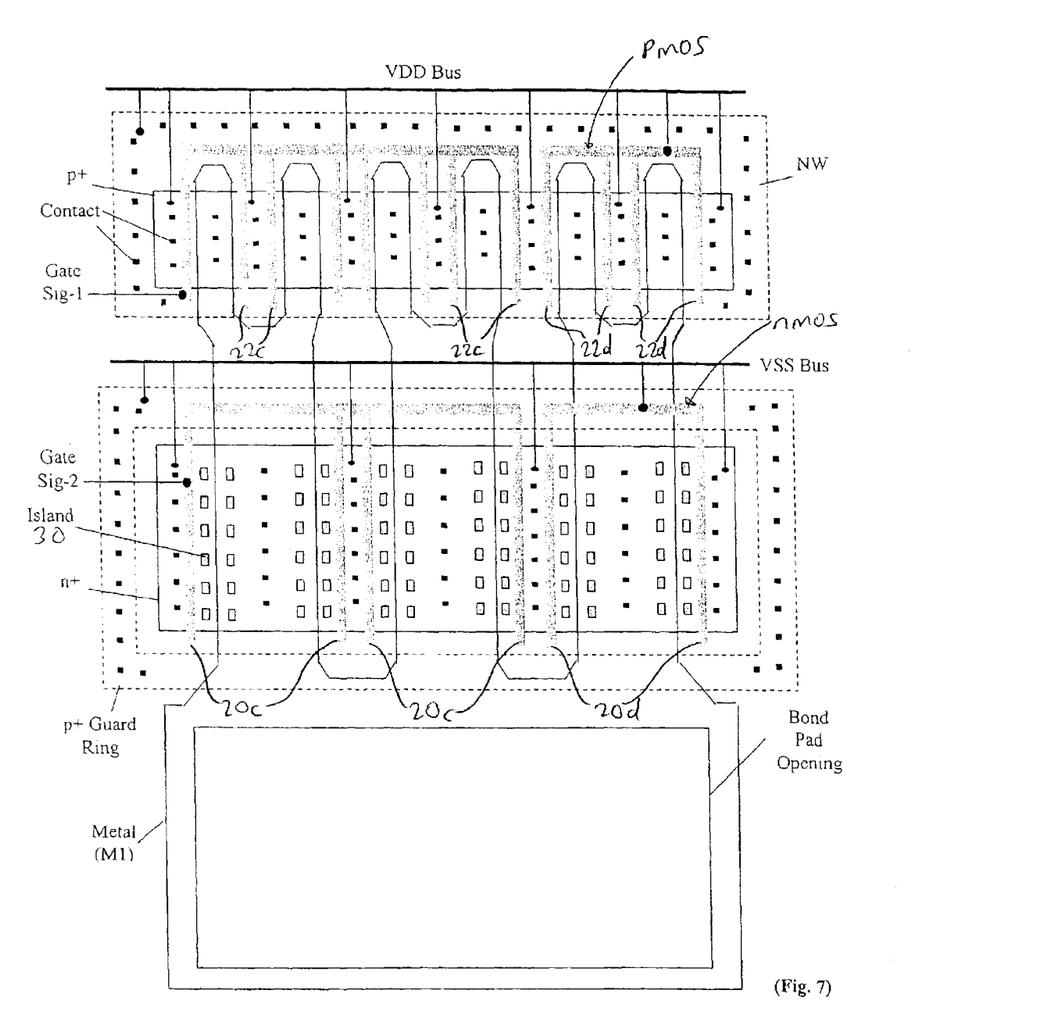
FIG. 7 is a layout of an I/O cell or ESD protection circuit according to yet another enbodiment of the present invention.
Figure 10:
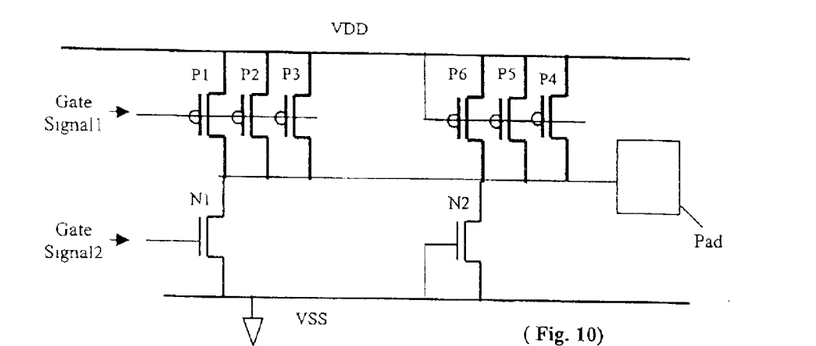
FIG. 10 illustrates the circuit schematics for the layout in FIG. 7.

FIG. 7 illustrates modifications that can be made to the layout in FIG. 5, where partial gate fingers 22c, 20c can be coupled to a gate signal, and other partial gate fingers 22d, 20d can be coupled to a power bus, for a typical application in an output or I/O circuit with good ESD protection. FIG. 10 illustrates the circuit schematics for the layout in FIG. 7.

FIG. 7 further illustrates the incorporation of islands 30 in the drain diffusion region of the NMOS transistor structure with larger contact to gate spacing. As an option, islands are not provided in the drain diffusion region of the PMOS transistor because a PMOS transistor does not operate in snap-back mode during an ESD event. On the other hand, islands function to promote uniform turn-on of the gate fingers of the NMOS transistor during an ESD event. As used herein, an island generally performs the function of directing or diverting a portion of electrical current from a contact to near a channel. Thus, the islands 30 in the layout of FIG. 7 help to improve the ESD protection.

An island can be considered as a structure or arrangement that divides or diverts electrical current. An island can be a physical structure that overlaps (either partially or completely) with an active source/drain (S/D) region. Here, an active S/D region can be defined as a region enclosed by surrounding isolation and a channel region. An island can be a current-routing structure, such as poly or field-oxide islands.

An island can also be a region that is fully or partially enclosed by a heavily doped region within an active region. Here, an active region is an active device region that is surrounded by an isolation region. For example, the source, drain and gate of a MOSFET transistor forming an active region is surrounded by an isolation (field-oxide) region. A heavily doped region can be a diffusion region (as all doped ions tend to diffuse under high temperature processing steps), which can be formed by ion implantation followed by thermal diffusion. Here, examples of an isolation region include LOCOS isolation and trench isolation.

An island may have a physical structure. Non-limiting examples include a dielectric layer over bulk (bulk can be a substrate or a well), or a floating conductive layer over a dielectric layer, or a non-floating conductive layer over a dielectric layer. Another non-limiting example of a physical island is one that at least partially overlaps with an active S/D region (e.g., of a MOSFET device) or an active emitter/collector region (e.g., of a field or bipolar device). Yet another non-limiting example of a physical island is a peninsula-like extension of the surrounding isolation region into a heavily doped region surrounded by the isolation region (i.e., an island extended from the surrounding isolation into an SID or emitter/collector region).

A non-limiting example of a physical island with a floating conductive element feature has a floating conductor element on a dielectric element, with the floating conductor element at least partially, or fully, overlapping an S/D (or emitter/collector) region. This floating conductor element may also overlap both with an S/D (or emitter/collector) region and with an isolation region.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. An ESD protection circuit, comprising:
   a VDD bus;
   a VSS bus;
   an IC pad;
   a PMOS transistor coupled to the IC pad and the VDD bus, and having a plurality of gate fingers, a plurality of source contacts, and a plurality of drain contacts;
   an NMOS transistor coupled to the IC pad and the VSS bus, and having a plurality of gate fingers, a plurality of source contacts, and a plurality of drain contacts;
   wherein the pitch of the PMOS is smaller than the pitch of the NMOS, with the pitch being defined as the distance between the center of a drain contact and the center of an adjacent source contact for the particular transistor; and
   wherein each gate finger has a length, and wherein the length of the gate fingers of the NMOS is greater than the length of the gate fingers of the PMOS.

2. The circuit of claim 1, wherein the pitch of the PMOS is less than 80% of the pitch of the NMOS.

3. The circuit of claim 1, wherein the pitch of the PMOS is less than or equal to 50% of the pitch of the NMOS.

4. The circuit of claim 1, wherein the gate fingers of the NMOS and the PMOS are parallel to each other.

5. The circuit of claim 1, wherein the NMOS has a gate finger, and the PMOS has a gate finger, with the gate finger of the NMOS and the gate finger of the PMOS being misaligned with respect to each other.

6. The circuit of claim 1, wherein the length of the gate fingers of the PMOS is less than 60% of the length of the gate fingers of the NMOS.

7. The circuit of claim 1, further including a bond pad, with the NMOS and the PMOS coupled to the same side of the bond pad.

8. The circuit of claim 1, wherein the NMOS and the PMOS each has a drain region, and further including a plurality of islands provided in the drain region of the NMOS.

9. The circuit of claim 8, wherein the drain region of the PMOS is devoid of islands.

10. The circuit of claim 1, further including a resistor which is coupled between a gate finger of the NMOS and the VSS power bus.

11. The circuit of claim 1, further including a capacitor which is coupled to a gate finger of the NMOS and the IC pad.

12. An input/output circuit, comprising:
   an IC pad;
   a PMOS transistor directly connected to the IC pad and gate signals, and having a plurality of gate fingers, a plurality of drain contacts and a plurality of source contacts; and
   an NMOS transistor directly connected to the IC pad and gate signals, and having a plurality of gate fingers, a plurality of drain contacts and a plurality of source contacts;
   wherein the pitch of the PMOS is smaller than the pitch of the NMOS, with the pitch being defined as the distance between the center of a drain contact and the center of an adjacent source contact for the particular transistor.

13. An electrical circuit, comprising:
   a PMOS transistor having a plurality of gate fingers, the PMOS transistor having a drain contact and a source contact;
   an NMOS transistor having a plurality of gate fingers, the NMOS transistor having a drain contact and a source contact;
   wherein the spacing between the drain contact and an adjacent one of the gate fingers (DCGS) for the PMOS is smaller than the DCGS for the NMOS; and
   wherein each gate finger has a length, and wherein the length of the gate fingers of the NMOS is greater than the length of the gate fingers of the PMOS.

14. The circuit of claim 13, wherein the DCGS for the PMOS is less than 81% of the DCGS for the NMOS.

15. The circuit of claim 13, wherein the DCGS for the PMOS is less than or equal to 51% of the DCGS for the NMOS.

16. The circuit of claim 13, wherein the NMOS DCGS is 5 um and the PMOS DCGS ranges from 1.5 um to 2.5 um.

17. The circuit of claim 13, wherein the PMOS has twice the number of gate fingers as the NMOS.

18. The circuit of claim 13, wherein the gate fingers of the NMOS and the PMOS are parallel to each other.

19. The circuit of claim 13, wherein the NMOS has a gate finger, and the PMOS has a gate finger, with the gate finger of the NMOS and the gate finger of the PMOS being misaligned with respect to each other.

20. The circuit of claim 13, wherein the length of the gate fingers of the PMOS is less than 61% of the length of the gate fingers of the NMOS.

21. The circuit of claim 13, further including a bond pad, with the NMOS and the PMOS coupled to the same side of the bond pad.

22. The circuit of claim 13, further including a plurality of islands provided in the drain region of the NMOS.

23. The circuit of claim 22, wherein the drain region of the PMOS is devoid of islands.

24. The circuit of claim 13, further including a resistor which is coupled between a gate finger of the NMOS and a VSS power bus.

25. The circuit of claim 13, further including a capacitor which is coupled to a gate finger of the NMOS and an IC pad.

26. The circuit of claim 13, wherein the spacing between the source contact and the gate (SCGS) for the PMOS is smaller than the SCGS for the NMOS.

* * * * *